(12) United States Patent
Sakuma

(10) Patent No.: US 9,312,025 B2
(45) Date of Patent: Apr. 12, 2016

(54) INFORMATION PROCESSING APPARATUS, NON-TRANSITORY COMPUTER-READABLE STORAGE MEDIUM AND REFRESH CONTROL METHOD

(71) Applicant: KONICA MINOLTA, INC., Chiyoda-ku (JP)

(72) Inventor: Keishi Sakuma, Iruma (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 29 days.

(21) Appl. No.: 14/449,743

(22) Filed: Aug. 1, 2014

(65) Prior Publication Data
US 2015/0043284 A1  Feb. 12, 2015

(30) Foreign Application Priority Data

Aug. 6, 2013  (JP) .................................. 2013-163217

(51) Int. Cl.
*G11C 16/34* (2006.01)
*G11C 7/04* (2006.01)

(52) U.S. Cl.
CPC ............... *G11C 16/3431* (2013.01); *G11C 7/04* (2013.01); *G11C 16/349* (2013.01)

(58) Field of Classification Search
CPC ........... G11C 16/3431; G11C 16/3418; G11C 16/349; G11C 7/04
USPC ........................................................ 365/222
See application file for complete search history.

(56) References Cited

U.S. PATENT DOCUMENTS

2001/0045579 A1* 11/2001 Ooishi ................. G11C 7/1006
257/222
2003/0007407 A1*  1/2003 Miyamoto ......... G11C 11/4078
365/222

(Continued)

FOREIGN PATENT DOCUMENTS

| JP | 2000-011670 A | 1/2000 |
| JP | 2009-140598 A | 6/2009 |
| JP | 2012-238364 A | 12/2012 |

OTHER PUBLICATIONS

Office Action (Notification of Reasons for Refusal) issued on Jun. 1, 2015, by the Japanese Patent Office in corresponding Japanese Patent Application No. 2013-163217, and an English translation of the Office Action. (6 pages)

*Primary Examiner* — Khamdan Alrobaie
(74) *Attorney, Agent, or Firm* — Buchanan Ingersoll & Rooney PC

(57) ABSTRACT

Provided are an information processing, a non-transitory computer-readable storage medium storing a refresh control program, and a refresh control method. An information processing apparatus which can work in a plurality of operation modes, includes: a flash memory; and a control section. The control section is configured to acquire an operating time period of each of the operation modes. The control section is further configured to calculate a weighted time period of each of the operation modes by weighting the operating time period of each of the operation modes by using a weighting coefficient of the corresponding operation mode. The control section is further configured to perform refresh processing of the flash memory when an integrated weighted time period exceeds a refresh threshold value which has been determined previously, where the integrated weighted time period is calculated by adding up the weighted time periods of the operation modes.

24 Claims, 9 Drawing Sheets

(56) References Cited

U.S. PATENT DOCUMENTS

2004/0196719 A1* 10/2004 Aritomi ............... G11C 11/406
365/222

2006/0203589 A1* 9/2006 Lee ...................... G11C 11/406
365/222

* cited by examiner

INFORMATION PROCESSING APPARATUS, NON-TRANSITORY COMPUTER-READABLE STORAGE MEDIUM AND REFRESH CONTROL METHOD

This application is based on Japanese Patent Application No. 2013-163217 filed on Aug. 6, 2013, in the Japan Patent Office, the entire content of which is hereby incorporated by reference.

TECHNICAL FIELD

The present invention relates to an information processing apparatus, a non-transitory computer-readable storage medium storing a refresh control program, and a refresh control method. In particular, the present invention relates to an information processing apparatus including a flash memory, a non-transitory computer-readable storage medium storing a program of conducting a refresh control of a flash memory, and a method of conducting a refresh control of a flash memory.

BACKGROUND

A flash memory has the data retention period which is short in comparison with other types of memory and remarkably dependent on environmental temperature, and decreases greatly with the rising of temperature. Accordingly, for an apparatus in which a flash memory is installed, a technique for preventing the missing of data in the flash memory, such as refreshing the flash memory periodically, is commonly used to secure the data reliability of the flash memory.

With regard to such refresh processing, Japanese Patent Application Laid-Open Publication (JP-A) No. 2000-11670 discloses an apparatus including a non-volatile memory. The apparatus includes a timer to measure the elapsed time after having performed a writing operation onto the non-volatile memory; a temperature sensor which measures a temperature in the vicinity of the non-volatile memory; a counter which counts the number of times of the writing operation performed onto the non-volatile memory; and a refresh circuit. In the above constitution, the refresh circuit is configured to give weight to the time measured by the timer according to the temperature measured by the temperature sensor and the number of times of the writing operation counted by the counter, and, is further configured to, when the weighted elapsed time measured by the timer exceeds a predetermined time after having performed the weighting, execute the writing operation again on the non-volatile memory.

In recent years, in order to improve an energy saving efficiency, information processing apparatuses generally have multiple operation modes (for example, Ready, Sleep, Power OFF, etc.) corresponding to the usage situations of the apparatuses. In these operation modes, it is expected that a temperature in an apparatus which is working in a certain operation mode is different from that in other operation modes. In particular, in apparatuses equipped therein with a heat source of high calorie, such as a laser beam printer and a MFP (Multi-Function Peripheral), a difference in temperature in the concerned apparatus among the operation modes becomes more appreciable.

In the case where a flash memory is used in an apparatus in which a difference in temperature in the apparatus among operation modes can occur, a large difference occurs in a data retention period of the flash memory among the operation modes depending on the ratio of time periods for which the apparatus has been working in respective operation modes. In view of the above problem, JP-A No. 2000-11670 discloses the technology that a temperature sensor is disposed in an apparatus so as to measure a temperature in the vicinity of the non-volatile memory, an elapsed time is weighted by using the temperature measured by the temperature sensor, and an execution timing of the refresh processing is adjusted. However, the technology of JP-A No. 2000-1670 needs the temperature sensor disposed in the apparatus, which lacks versatility. Further, the technology needs the temperature sensor always driven to measure the temperature, which causes problems about wasteful electricity consumption and an increase of the load on a CPU.

Further, the data retention period of a flash memory lowers also by writing data into the flash memory. If describing concretely, a general flash memory is composed of a MOS (Metal Oxide Semiconductor) transistor (cell) in which a gate electrode is made in a two layer structure. General flash memories can be grouped into NOR type flash memories and NAND type flash memories. In a NOR type flash memory, data can be read, written, erased and rewritten at the single-byte level (that is, a source line and a bit line are connected to each cell). In a NAND type flash memory, data can be read, written, erased and rewritten at the level of plural bytes, in other words, at the block level (that is, multiple bits are serially connected between a source line and a bit line). In any case, by applying a high electric field between a floating gate and a silicon substrate, electrons are made to perform tunneling for a gate insulating film, and injected into a floating gate. With this, information is memorized by utilizing a change of a gate voltage (threshold voltage) at which the MOS transistor changes from an OFF state to an ON state.

Accordingly, if the number of times of writing data for the flash memory increases, the gate insulating film deteriorates due to the tunneling of electrons, the electrons injected into the floating gate are made to escape easily to the silicon substrate, and a data retention period becomes short. In particular, in a NAND type flash memory, data is written at the block level, even when writing is performed on cells in a part of a block, which increases the number of times of the writing data substantially. Thereby, the degradation of the gate insulating film advances and a data retention period becomes short. Then, in the above-mentioned technology of JP-A No. 2000-11670, the number of times of writing data is counted and the elapsed time is weighted by using the counted number. Thereby, an execution timing of the refresh processing is adjusted.

Furthermore, the data retention period of a flash memory lowers also by reading data from the flash memory. For example, in a NAND type flash memory, word lines adjoin to each other and cells connected to the same bit line are connected to each other in a form configured to share a source and a drain. In a reading operation, the selected word lines (control gates) are applied with a low voltage, and the non-selected word lines are applied with a pass voltage higher than a threshold voltage at the time of writing. Accordingly, electrons are made tunneling injection from the silicon substrate into the floating gate of non-selected cells, whereby the threshold voltage of the non-selected cells rises slightly. Therefore, if a reading operation is repeatedly performed for the same cell and an erasing operation is not performed at all, the threshold voltage of the non-selected cells rises gradually, and it becomes difficult to read the right value. As a result, the data retention period becomes short. In this way, although the data retention period becomes also short depending on the number of times of reading data for the flash memory, the technology of JP-A No. 2000-11670 takes only the number of times of writing data into consideration, which hardly carries out an appropriate adjustment of a timing to perform the refresh processing.

In view of such a problem, the execution of the refresh processing at constant intervals in order to secure data reliability is inefficient, and there is fear that the refresh processing itself causes the deterioration of the flash memory (in particular a gate oxide film) and the decrease of the data retention period. That is, in the refresh processing, electrons are extracted from the floating gate by applying high voltage to the silicon substrate side, and then, electrons are injected by applying high voltage to the floating gate side. Accordingly, if the number of times of the application of high voltage increases, the gate oxide film deteriorates, and the data retention period becomes short. Further, by executing the refresh processing, there is also a problem that a large load is applied to a control section to control the refresh processing. The present invention seeks to solve those problems.

SUMMARY

There are disclosed illustrative information processing apparatuses, non-transitory computer-readable storage media each storing a program of conducting a refresh control of a flash memory, and methods of conducting a refresh control of a flash memory.

An illustrative information processing apparatus reflecting one aspect of the present invention is an information processing apparatus which can work in a plurality of operation modes. The information processing apparatus comprises: a flash memory; and a control section. The control method is configured to acquire a time period for which the information processing apparatus has been working in each of the operation modes, as an operating time period of each of the operation modes. The control method is further configured to calculate a weighted time period of each of the operation modes by weighting the operating time period of each of the operation modes by using a weighting coefficient of the corresponding operation mode. The control method is further configured to perform refresh processing of the flash memory, on an integrated weighted time period exceeding a refresh threshold value which has been determined previously, where the integrated weighted time period is calculated by adding up the weighted time periods of the operation modes.

A non-transitory computer-readable medium reflecting one aspect of the present invention stores a refresh control program to be executed in an information processing apparatus which can work in a plurality of operation modes and includes a flash memory. The refresh control program, when being executed by a processor of the information processing apparatus, causes the processor to perform processes comprising: acquiring a time period for which the information processing apparatus has been working in each of the operation modes, as an operating time period of each of the operation modes; and calculating a weighted time period of each of the operation modes by weighting the operating time period of each of the operation modes by using a weighting coefficient of the corresponding operation mode. The processes further comprises comparing an integrated weighed time period with a refresh threshold value which has been determined previously, where the integrated weighted time period is calculated by adding up the weighted time periods of the operation modes; and performing refresh processing of the flash memory, on the integrated weighted time period exceeding the refresh threshold value.

An illustrative refresh control method reflecting one aspect of the present invention is a refresh control method of an information processing apparatus which can work in a plurality of operation modes and includes a flash memory. The method comprises: acquiring a time period for which the information processing apparatus has been working in each of the operation modes, as an operating time period of each of the operation modes; and calculating a weighted time period of each of the operation modes by weighting the operating time period of each of the operation modes by using a weighting coefficient of the corresponding operation mode. The method further comprising comparing an integrated weighed time period with a refresh threshold value which has been determined previously, where the integrated weighted time period is calculated by adding up the weighted time periods of the operation modes; and performing refresh processing of the flash memory, on the integrated weighted time period exceeding the refresh threshold value.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

Figure 4A:
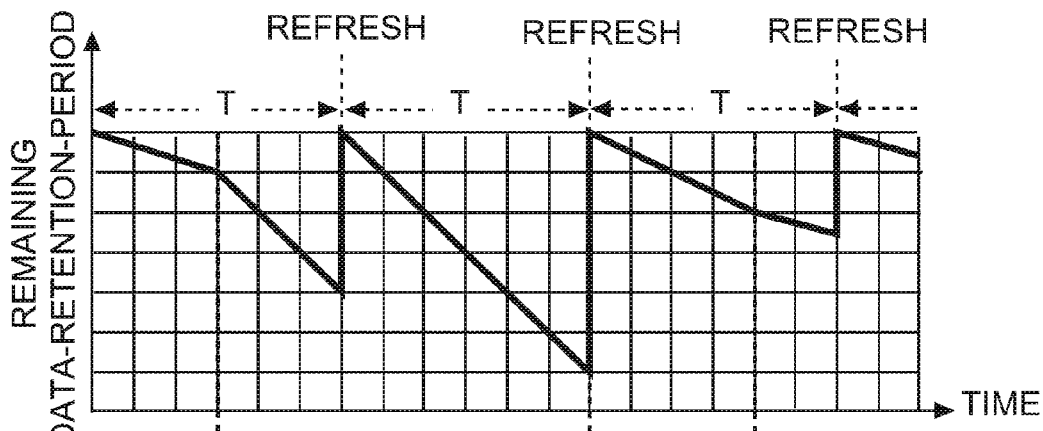
Figure 4B:
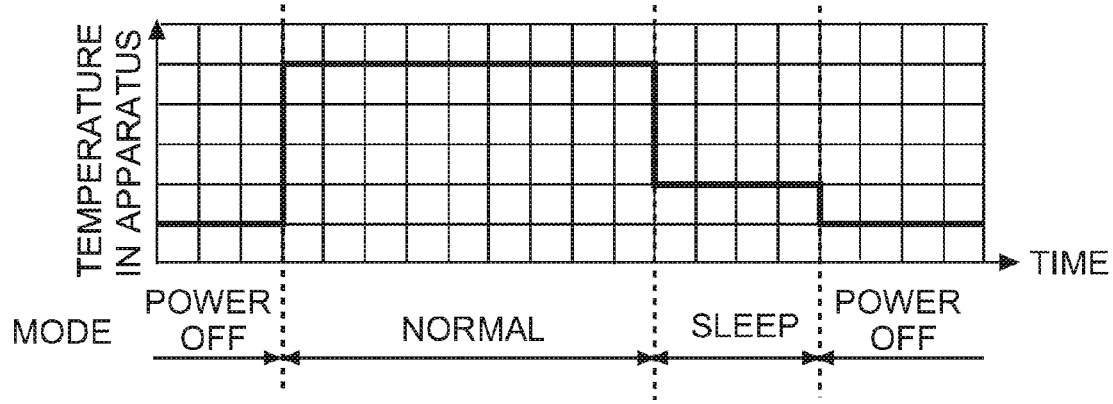
Figure 5A:
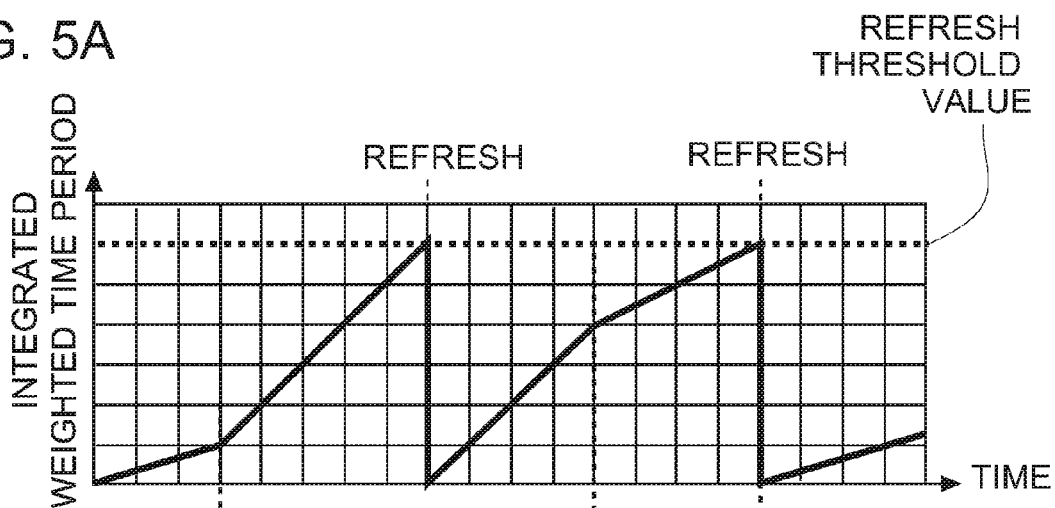
Figure 5B:
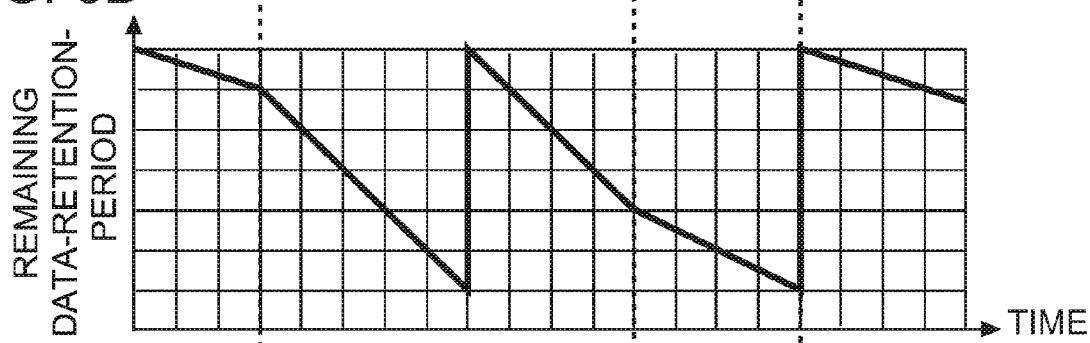
Figure 5C:
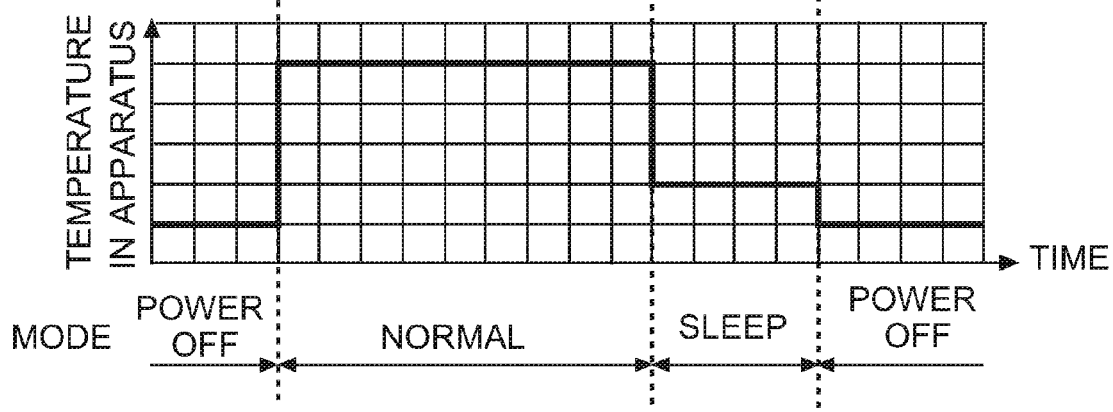
Figure 6:
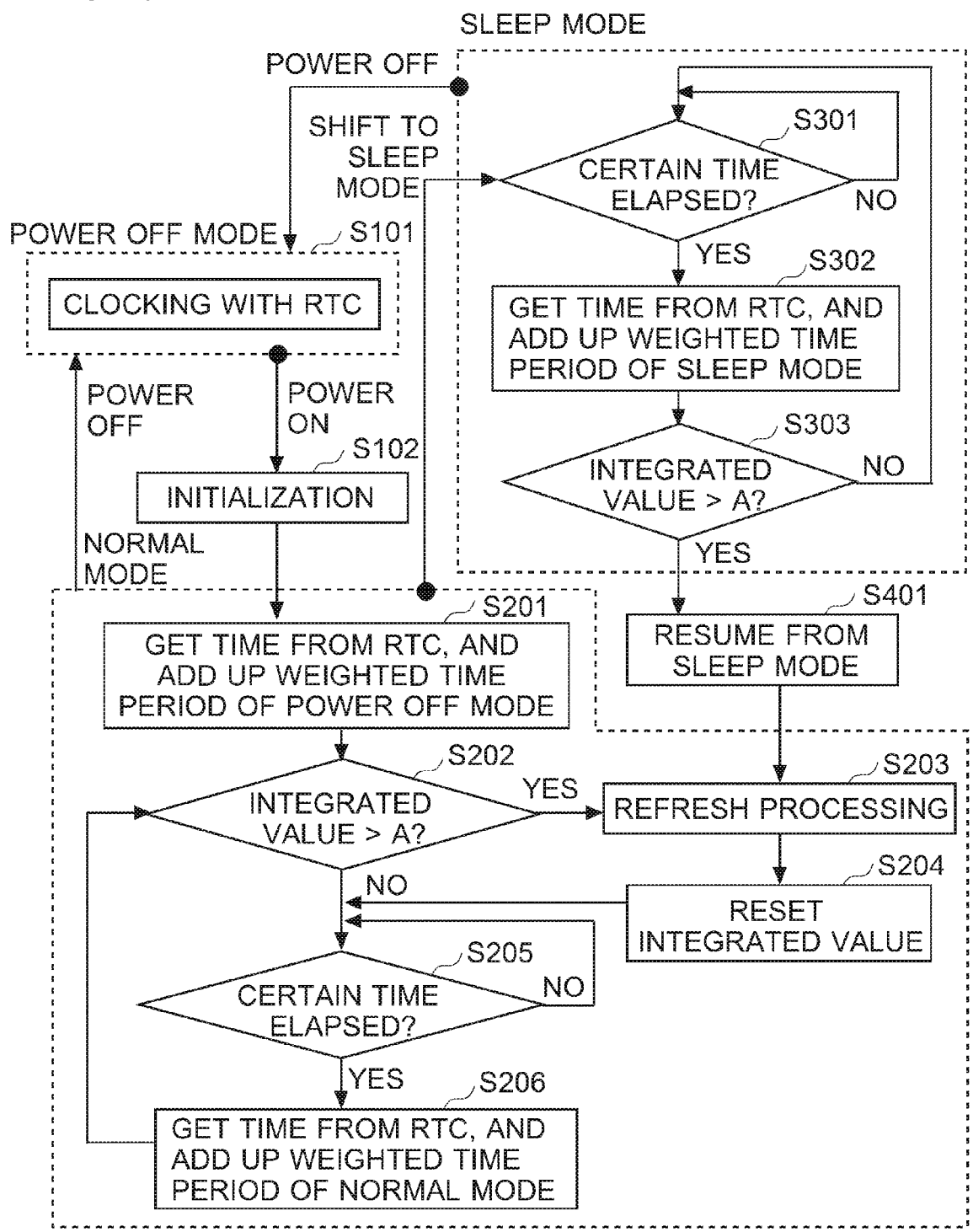
Figure 7:
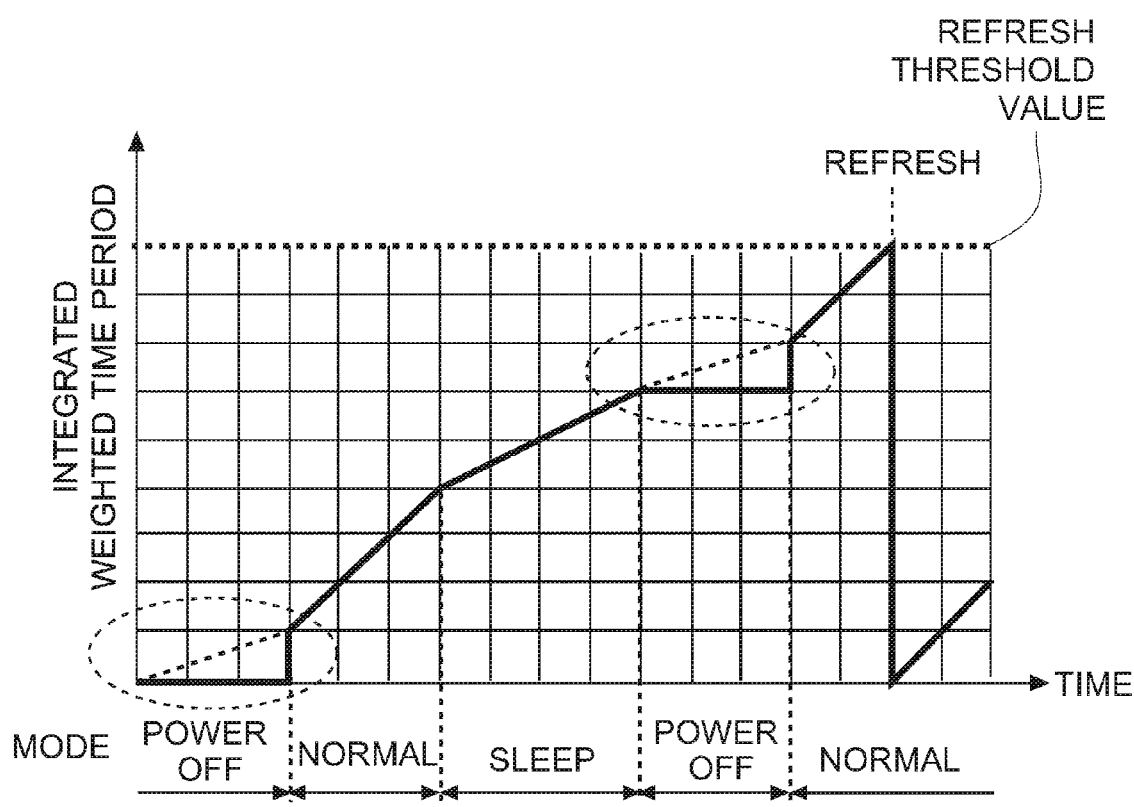
Figure 8A:
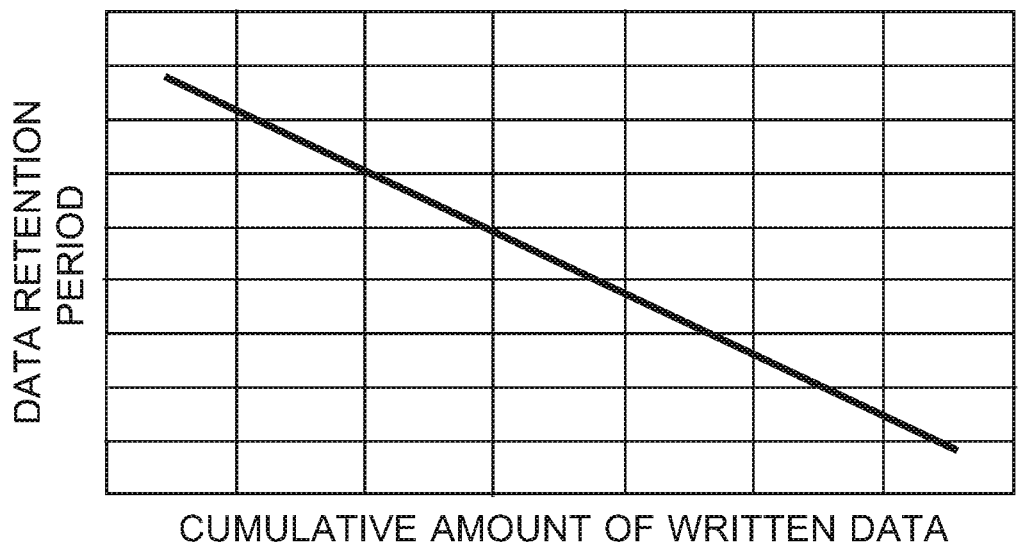
Figure 8B:
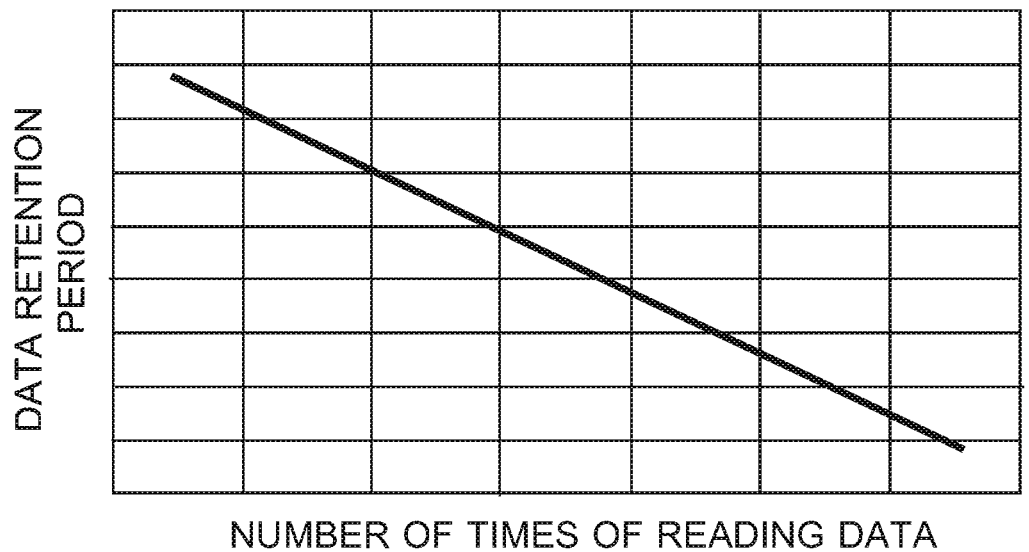
Figure 9A:
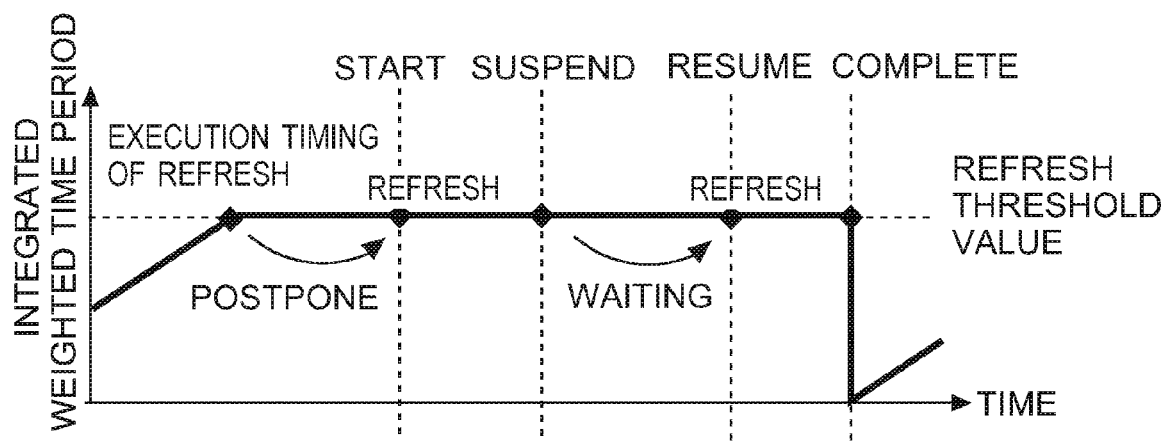
Figure 9B:
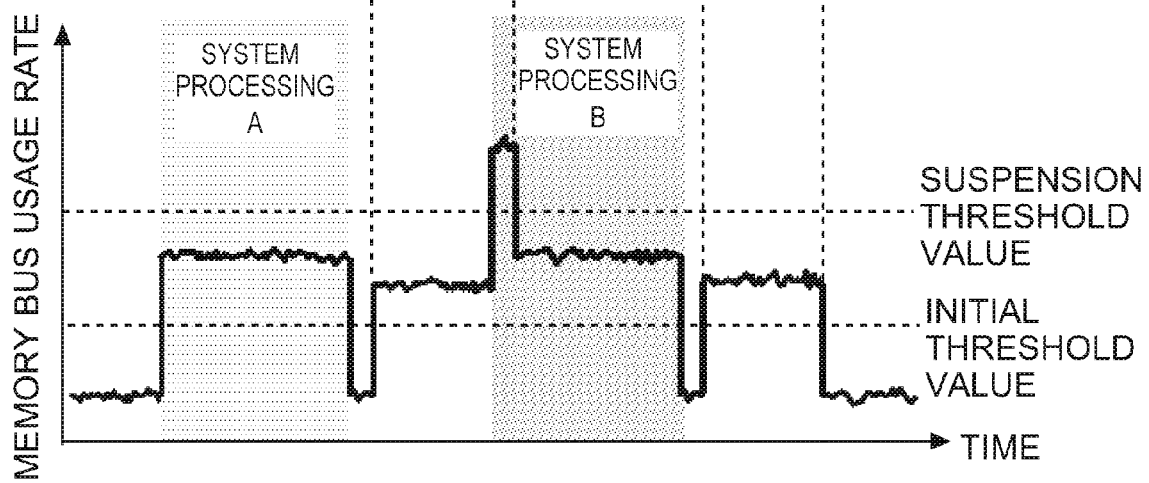
Figure 10:
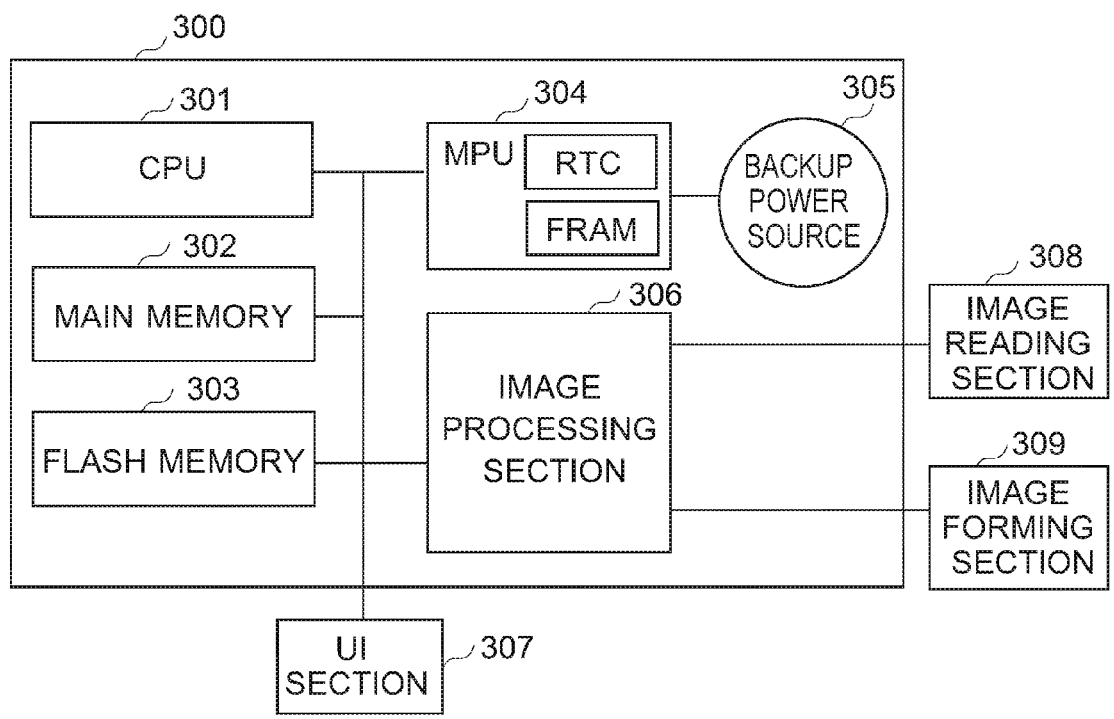
Figure 11:
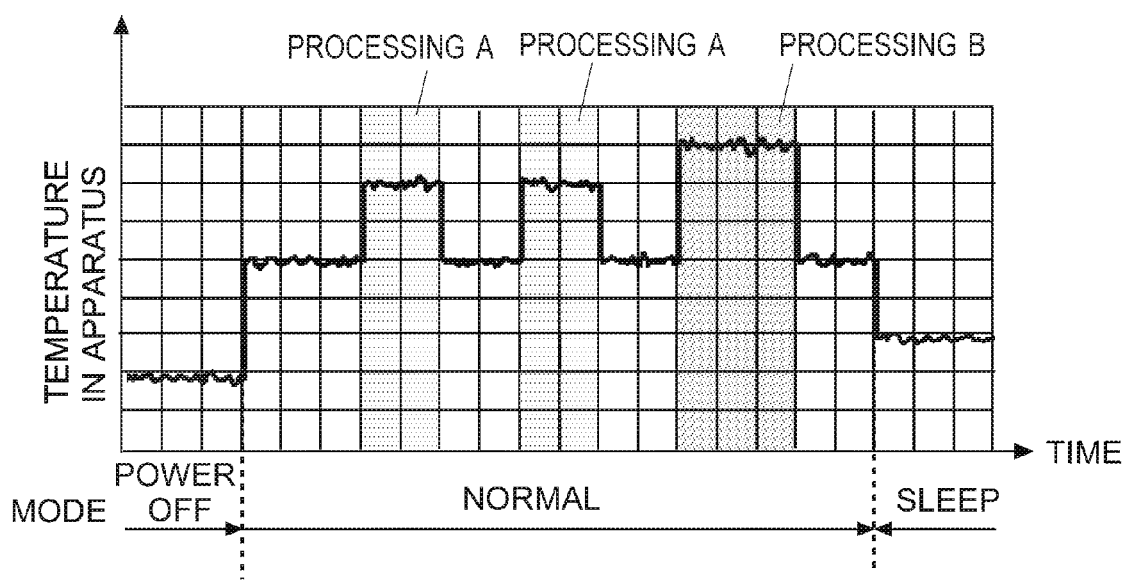
Figure 12:
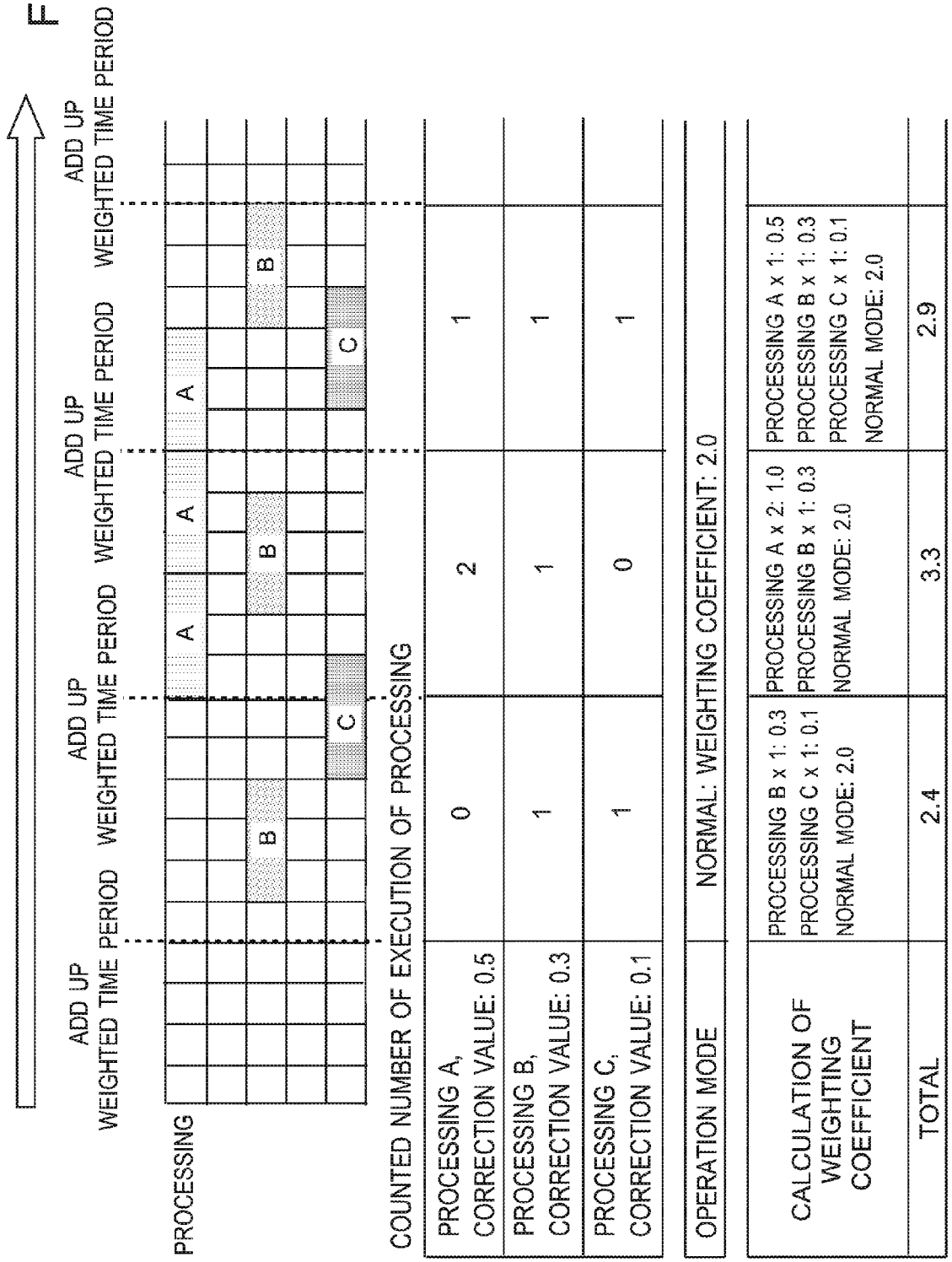

Each of FIGS. 4A and 4B is a timing chart illustrating general refresh processing for a flash memory;

Each of FIGS. 5A to 5C is a timing chart illustrating the refresh processing for a flash memory according Example 1;

FIG. 6 is a flowchart illustrating operations of the information processing apparatus according to Example 1;

FIG. 7 is a diagram for illustrating an integration calculation of a time period of the power OFF in the refresh control for a flash memory according to Example 1;

Each of FIGS. 8A and 8B is a diagram illustrating the dependency of the data retention period of a flash memory on each of a cumulative amount of written data and a number of times of reading data, according to Example 2;

Each of FIGS. 9A and 9B is a timing chart illustrating refresh processing for a flash memory according to Example 3;

FIG. 10 is a block diagram illustrating an example of the constitution of an information processing apparatus according to Example 5;

FIG. 11 is a diagram illustrating a temperature in an apparatus at the time of execution of each process in the information processing apparatus according to Example 5; and FIG. 12 is a diagram for illustrating correction of weighting coefficients by using the counted number of times of execution of processes in the information processing apparatus according to Example 5.

DETAILED DESCRIPTION

Illustrative embodiments of information processing apparatuses, non-transitory computer-readable storage media each storing a refresh control program and refresh control methods will be described with reference to the drawings. It will be appreciated by those of ordinary skill in the art that the description given herein with respect to those figures is for exemplary purposes only and is not intended in any way to limit the scope of potential embodiments may be resolved by referring to the appended claims.

According to information processing apparatuses, non-transitory computer-readable storage media each storing a refresh control program and refresh control methods as embodiments of the present invention, refresh processing for a flash memory can be controlled appropriately with a simple constitution.

The reason is that a control section of an illustrative information processing apparatus is configured to perform the following processing. The control section measures (acquires) an operating time period of each of the operation modes, and calculates a weighted time periods of each of the operation modes by weighting the measured operating time period of each of the operation modes by using a weighting coefficient of the corresponding operation mode. The control section further calculates an integrated weighted time period by adding up the weighted time periods of the operation modes. When the integrated weighted time period exceeds a refresh threshold value which has been determined previously, the control section performs refresh processing of the flash memory.

As indicated in the descriptions of the background, in an apparatus in which a flash memory is installed, refresh processing is executed periodically to secure data reliability. However, the data retention period of a flash memory is influenced by temperature. In view of that, in the technology disclose by JP-A No. 2000-11670, an elapsed time is weighted based on the measured temperature by a temperature sensor disposed in the vicinity of a non-volatile memory, and an execution timing of refresh processing is adjusted based on the weighed elapsed time. However, the constitution configured to dispose a temperature sensor lacks versatility, and there is a problem that consumed electric power and the load on a CPU increase. Further, since the data retention period of a flash memory is also influenced by the number of times of data writing and the number of times of data reading for the flash memory, in order to adjust appropriately the execution timing of refresh processing, correction based on the number of times of writing and the number of times of reading is further required.

On the other hand, information processing apparatuses in recent years are provided with multiple operation modes, and in each of the multiple operation modes, it has been determined that what kind of a constitutional element operates in what way. Accordingly, it becomes possible to specify the temperature in the apparatus in each operation mode. That is, there is a correlation between the temperature in the apparatus and the period of time having operated at each operation mode.

In view of that, an illustrative information processing apparatus including a flash memory, as one embodiment of the present invention, is configured to conduct the following control. The information processing apparatus measures (acquires) a time periods for which the information processing apparatus has been working in each of the operation modes, and calculates a weighted time period of each of the operation modes by weighting the measured operating time period of each of the operation modes by using a weighting coefficient of the corresponding operation mode (in other words, based on a temperature in the apparatus correlated with each of the operation modes). When an integrated weighted operating time period exceeds a predetermined threshold value, where the integrated weighted time period is calculated by adding up the calculated weighted time periods of the operation modes, the control section perform refresh processing of the flash memory. Further, in addition to the processing, the control section corrects the weighted time periods according to the number of times of writing data (the amount of written data) and the number of times of reading data. With this, the illustrative information processing apparatus can control the refresh processing on the flash memory appropriately with a simple constitution.

EXAMPLES

Example 1

Figure 1:
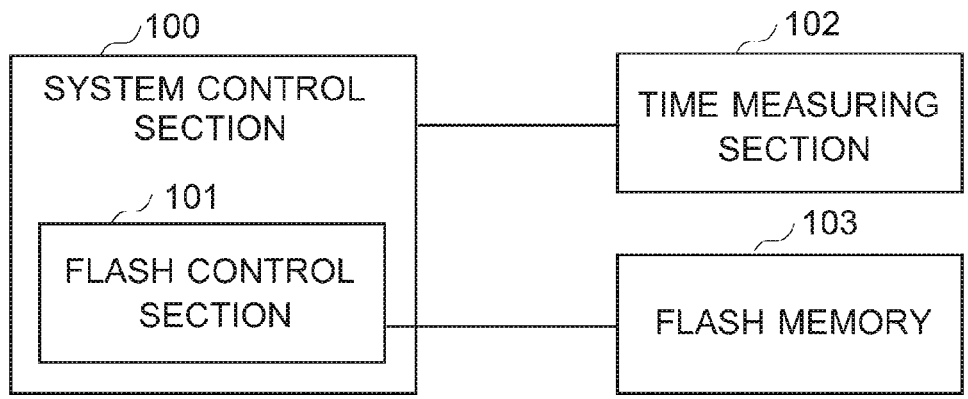
FIG. 1 is a block diagram illustrating an example of the constitution of an information processing apparatus of one embodiment of the present invention.
Figure 2:
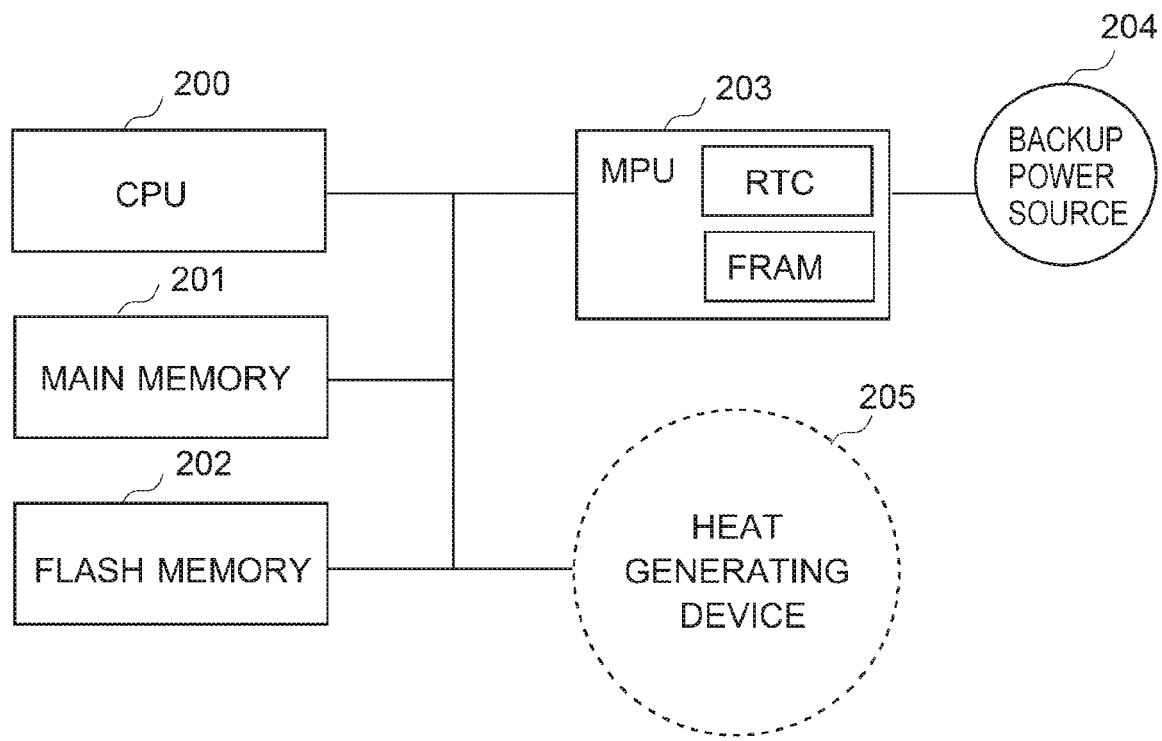
FIG. 2 is a block diagram illustrating an example of the constitution of an information processing apparatus according to Example 1.
Figure 3:
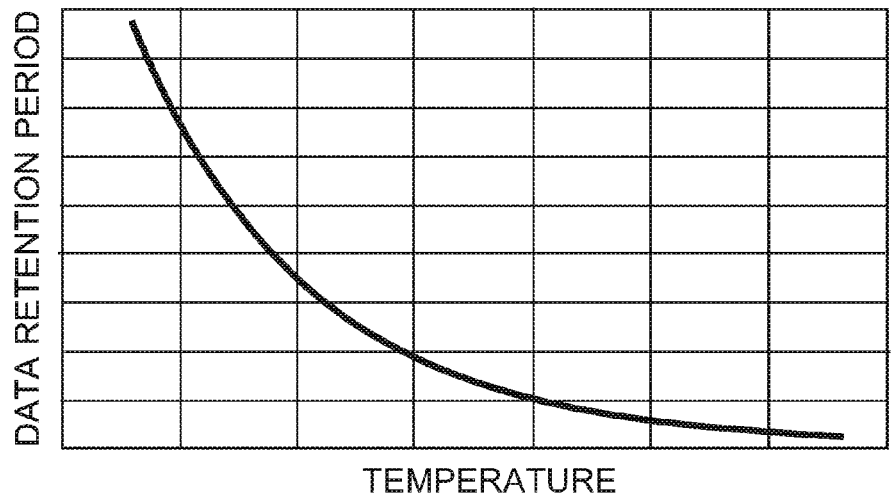
FIG. 3 is a diagram illustrating the temperature dependency of a data retention period of a flash memory.

In order to describe the embodiment of the present invention in more details, description is given to an illustrative information processing apparatus, a non-transitory computer-readable storage medium storing a refresh control program, and a refresh control method according to Example 1 with reference to FIGS. 1 to 7. FIG. 1 is a block diagram illustrating an example of the constitution of an information processing apparatus of an embodiment of the present invention, and FIG. 2 is a block diagram illustrating an example of the constitution of an information processing apparatus according to Example 1. Further, FIG. 3 is a diagram illustrating the temperature dependency of a data retention period of a flash memory, and FIGS. 4A and 4B and FIGS. 5A to 5C are a timing chart illustrating general refresh processing for a flash memory and a timing chart illustrating the refresh processing for a flash memory according Example 1, respectively. Furthermore, FIG. 6 is a flowchart illustrating operations of the information processing apparatus according to Example 1, and FIG. 7 is a diagram for illustrating an integration calculation of a time period of the power OFF in the refresh control for a flash memory according to Example 1.

An illustrative information processing apparatus, as illustrated in FIG. 1, includes a system control section 100 configured to control the whole system, a flash control section 101 configured to control a flash memory 103, a time measuring section 102 configured to measure time, and a flash memory 103 serving as a rewritable non-volatile memory.

FIG. 2 illustrates an example of a constitution of the information processing apparatus. The information processing apparatus of the present example includes, for example, a CPU (Central Processing Unit) 200; a main memory 201, such as a ROM (Read Only Memory) and a RAM (Random Access Memory); a flash memory 202; a MPU (Micro-Processing Unit) 203; a backup power source 204; a heat generating device 205; and so on, and is able to work in multiple operation modes.

The CPU 200 and the main memory 201 constitute a control section, and the control section is configured to perform control for the whole of the information processing apparatus and control for the operating state of each constitutional element corresponding to each operation mode. Further, the control section incorporates a flash memory control function and controls reading, writing, erasing, and rewriting of data for the flash memory 202. Furthermore, the control section is configured to perform the following processing about refresh processing. The control section acquires a time period for which the information processing apparatus has been working in each operation mode (called as an operating time period of each operation mode) from the MPU 203. The control section calculates a weighted operating time period (also called as a weighted time period) of each operation mode by weighting the operating time period of each operation mode according to the corresponding operation mode. The control section compares an integrated time period (called as the integrated weighted time period) obtained by adding up the respective weighted time periods of the operation modes with a preliminarily-memorized threshold value. If the integrated weighted time period exceeds the threshold value, the control section executes refresh processing of the flash memory 202. This flash memory control function can be realized in such a way that the CPU 200 develops a refresh control program memorized in the ROM into the RAM and executes the program.

The MPU 203 includes a RTC (Real Time Clock) and a FRAM (Ferroelectric Random Access Memory) (trademark), and is configured to measure time (the operating time period of each operation mode), and to notify the measured time to the CPU 200. To the MPU 203, a backup power source 204, such as a battery, is coupled, and the MPU 203 is constituted so as to be able to continue measuring time with electric power supplied from the backup power source 204 even in a state that a power source supplied to the information processing apparatus is OFF.

Further, the information processing apparatus includes the heat generating device 205 controlled by the CPU 200. Accordingly, depending on the operating state of the heat generating device 205, the temperature inside the information processing apparatus may change greatly. That is, since the operating state of the heat generating device 205 is determined in response to an operation mode, there exists a correlation between the operation mode and the temperature in the apparatus. Accordingly, if the operating time period of a certain operation mode is known, it is possible to predict a change of the data retention period of the flash memory 202 coming from the temperature in the apparatus.

Hereinafter, based on the information processing apparatus illustrated in FIG. 2, description is given to refresh processing for the flash memory 202.

First, a relationship between the operation mode and the temperature in the apparatus is described. Here, it is assumed that the operation mode includes three operation modes, such as a power OFF mode, a power saving mode, and a normal mode. TABLE 1 shows the way to control the operating state of each of constitutional elements (CPU, main memory, flash memory, MPU, RTC, heat generating device) in each operation mode. Since each constitutional element generates a prescribed amount of heat in accordance with its operating state, a temperature in the information processing apparatus changes in accordance with the operation mode. In particular, in the case of there exists the heat generating device 205, in response to whether the heat generating device 205 operates, the temperature in the information processing apparatus changes greatly. That is, in the normal mode in which the heat generating device 205 works, the temperature inside the apparatus becomes a high value as compared with the other operation modes.

In this way, a prescribed amount of heat is generated inside the apparatus according to an operation mode, and the temperature in the apparatus becomes a temperature corresponding to the operation mode. Accordingly, even if the temperature in the apparatus is not measured actually with a temperature sensor, the temperature in the apparatus can be specified by judging which operation mode the apparatus is currently working in. Here, although the temperature in the apparatus is influenced by an environmental temperature, the information processing apparatus is installed in many situations, for example, in offices, at a location subjected to temperature control with an air conditioner. Accordingly, if neither an area nor a season changes, it may be considered that the environmental temperature is an almost fixed value. In particular, in the case where a heat source with a large amount of heat generation is located in the information processing apparatus, the influence of environmental temperature becomes small. Therefore, in the case of a printer or a MFP, it may be considered that the temperature in the concerned apparatus becomes an almost fixed value in response to an operation mode.

Next, description is given to a relationship among the temperature in an apparatus, a data retention period of a flash memory, and an execution timing of refresh processing. Generally, the data retention period of a flash memory is comparatively short, and is remarkably dependent on the temperature in the vicinity of the flash memory. As illustrated in FIG. 3, the data retention period decreases greatly with the rising of temperature. Then, conventionally, as illustrated in FIG. 4A and FIG. 4B, the refresh processing has been executed at fixed time intervals (T) so as to avoid the risk of data missing.

However, in this technology, the fact that the temperature in the apparatus depends on each operation mode is not taken into consideration. Accordingly, a remaining data-retention-period (a period during which it is predicted that it is possible to retain data) at the time of executing the refresh processing becomes different for each time of executing the refresh processing. For example, in the case of a power OFF mode, the temperature in the apparatus becomes a constant low value, and the decreasing speed of the remaining data-retention-period is small. On the other hand, in the case of a normal mode, the temperature in the apparatus becomes a constant high value, and the decreasing speed of the remaining data-retention-period is large. Accordingly, the remaining data-retention-period changes depending on the operation mode or operation modes in which the apparatus has actually been working in each time interval T.

In particular, in the case where the ratio of the operating time period of the sleep mode and/or the power OFF mode is high (in the case of the third time interval T from the left in FIG. 4A and FIG. 4B), the remaining data-retention-period becomes long, which causes the case where there is no need

TABLE 1

| Operation Mode | Operating State of Elements | | | | | | Temperature in Apparatus |
|---|---|---|---|---|---|---|---|
| | CPU | Main Memory | Flash Memory | MPU | RTC | Heat Generating Device | |
| Power OFF | OFF | OFF | OFF | OFF | ON (battery drive) | OFF | Ave. 25° C. |
| Power Saving | Power saving | Power saving | OFF | ON | ON | OFF | Ave. 27° C. |
| Normal | ON | ON | ON | ON | ON | ON | Ave. 50° C. | to execute the refresh processing. However, even in such a case, when the time interval T has elapsed, the refresh processing is executed in the above-described technology. Accordingly, in proportion to the operation of a flash memory control function, a useless load is applied to the CPU 200. Further, erasing and wiring of data can be executed during the refresh processing, and a high voltage is applied to a gate insulating film under this condition. Accordingly, the gate insulating film deteriorates, which causes the decrease of the absolute value (the data retention period from immediately after the refresh processing) of the data retention period.

On the contrary, in the case where the ratio of the operating time period of the normal mode is high (in the case of the second time interval T from the left in FIG. 4A and FIG. 4B), the remaining data-retention-period becomes short, which causes the case where the refresh processing must be performed urgently. However, even in such a case, the refresh processing is not executed until the time interval T has elapsed in the above-described technology. Accordingly, the risk of data missing becomes high. Further, if the time interval T is set to short in order to avoid the risk of data missing, an increase in the load to the CPU 200 and a decrease in the data retention period appear notably.

In view of this problem, according to the conventional technology, a temperature sensor was disposed in an apparatus, the temperature of the apparatus is actually measured to give weight to a data retention period. However, this technology is hardly applied to an apparatus in which a temperature sensor is not disposed. Further, continuing the measurement of temperature causes useless electric power consumption and an increase of load on the processor. On the other hand, as mentioned above, a temperature in an apparatus has a correlation with an operation mode, and if the temperature is constant, a data retention period decreases at a fixed rate.

In the present example, instead of always measuring a temperature in an apparatus, the temperature in the vicinity of the flash memory at the time of operating in each operation mode has been once measured (or simulated) and memorized. Subsequently, the refresh processing is made to be executed at optimal intervals based on a correlation between the temperature in the apparatus and each operation mode and a correlation between the temperature in the apparatus and an amount of a decrease of a data retention period, where the optimal interval is defined with a change of the data retention period caused by the temperature in the apparatus being taken into consideration.

In concrete terms, first, the control section measures the operating time period of each operation mode. Then, the control section calculates the weighted operating time period of each operation mode by weighting the operating time period of each operation mode based on a temperature in the apparatus in the corresponding operation mode, and further calculates the integrated weighted time period by integrating (adding up) the weighted operating time periods. Then, the control section performs the refresh processing if the integrated weighted time period exceeds a predetermined threshold value.

FIGS. 5A to 5C illustrate the case where the refresh processing is executed in the above-mentioned procedures. If a remaining data-retention-period becomes a prescribed value or less (if the integrated weighted time period exceeds the predetermined refresh threshold value), the refresh processing is executed. Namely, in the case where the ratio of operating period in the sleep mode and/or the power OFF mode is large, since the reduction rate of a remaining data-retention-period becomes small, the interval of executing the refresh processing is made longer. On the other hand, in the case where the ratio of the operating period of the normal mode is large, since the reduction rate of a remaining data-retention-period becomes large, the interval of executing the refresh processing is made shorter. By performing such a refresh control, it becomes possible to prevent beforehand the problems that the refresh processing is executed regardless of the existence of a margin in the remaining data-retention-period, and that the refresh processing is not executed regardless of the nonexistence of a remaining data-retention-period. As a result, the refresh processing can be executed optimally with a simple constitution.

Next, description is given concretely to the refresh processing in an information processing apparatus illustrated in FIG. 2. The CPU 200 is adapted to develop a refresh control program memorized in the ROM into the RAM and to execute it, thereby performing a process in a flowchart illustrated in FIG. 6.

Integration of Elapsed Time During the Power Source Off:

With the refresh control of the present example, in the course of the power source OFF, the RTC 203 performs clocking with a very small amount of electric power supplied from the backup power source 204 such as battery, whereby the time period of the power OFF mode can be utilized as a factor to determine an execution timing of the refresh processing. In the concrete terms, as illustrated in FIG. 6, during the power source OFF, only the clocking is performed by the RTC 203 which is driven by electric power from the backup power source 204 (S101). Subsequently, after the power source ON, upon completion of the initialization of the information processing apparatus (S102), the process shifts to the normal mode, and then, the time elapsed during the power source OFF is calculated from a difference between the current time and the time right before the last power source OFF, and the time period of the power OFF mode is obtained. Further, a weighted time period of the power OFF mode is calculated by weighting the obtained time period according to the temperature in the apparatus at the time of the power source OFF, and is added up (S201).

FIG. 7 illustrates the integration calculation of the weighted time period of the power OFF mode. The time period of the power OFF mode is calculated from a difference between the time of the power source ON and the time right before the last power source OFF. Further, by measuring beforehand the temperature in the apparatus in the power OFF mode, the reduction rate of the data retention period in the power OFF mode is uniquely determined. Accordingly, the time period of the power source OFF is multiplied with the reduction rate of the data retention period, and the resulting weighted time period is added up to obtain the integrated weighted time period (refer to the inside of the broken line frame illustrated in FIG. 7). Subsequently, when the operation mode shifts from the power OFF mode to the normal mode, the obtained integrated weighted time period is made to a base point, and the weighted time period of the normal mode is further added up to the integrated weighted time period.

Calculation of a Weighted Operating Time Period:

In each operation mode, for calculating a weighted operating time period after an operating time period has been measured (S205 and S206 in the normal mode, and S301 and S302 in the sleep mode), the following calculations may be considered.

The first calculation is a calculation using a preliminarily-prepared table. In concrete terms, based on the temperature dependency of a data retention period acquired preliminarily by experiment, simulation, etc., a weighting coefficient table, including a weighting coefficient defined for each temperature, has been prepared previously, and then, a weighted operating time period is calculated with reference to this weighting coefficient table.

The second calculation is a calculation using pre-set formulas with regard to a weighted operating time period. In concrete terms, for example, in the case where it is supposed that a relationship between a data retention period R (unit: hour) and a temperature T (unit: K) is given by Formula 1 (that is, a data retention period is a function of a temperature), A (unit: hour) represented by Formula 2 is set to a refresh threshold value by using a temperature T0 (unit: K) in the apparatus at the time of the power source OFF as the reference (where a weighting coefficient at the time of the power source OFF is set to 1).

$$R=F(T) \qquad (1)$$

$$R0=F(T0)=A \qquad (2)$$

At this time, when the temperature in the apparatus at the time of sleep is set to T1 (unit: K) and the temperature in the apparatus at the time of normal is set to T2 (unit: K), the weighting coefficient of each operation mode becomes as follows.

$$\text{Weighting coefficient of sleep mode}=F(T0)/F(T1) \qquad (3)$$

$$\text{Weighting coefficient of normal mode}=F(T0)/F(T2) \qquad (4)$$

Refresh Control:

Subsequently, when the integrated result of the weighted operating time periods of the respective operation modes exceeds the above-mentioned refresh threshold value (Yes at S202 in the normal mode, Yes at S303 in the sleep mode, and S401), the refresh processing is executed (S203). As this refresh processing, the following ways may be considered in accordance with the kinds of a flash memory to be used.

(1) Lead all the memory regions to be refreshed, and rewrite the led data again on the same memory region.
(2) Lead all the memory regions to be refreshed.
(3) In the case where a refresh function is provided to a flash memory device side, send a refreshment execution command from a control section (fresh control function) to the flash memory device, and let the device side execute the refresh processing.

Then, after having executed the refresh processing by any one of the above ways, the integrated weighted time period is made reset (S204).

In this way, the control section acquires an operating time period of each of the operation modes, and calculates a weighted time period of each of the operation modes by weighting the operating time period of each of the operation modes according to the corresponding operation mode (in other words, according to the temperature in the apparatus correlated with the corresponding operation mode). The control section performs refresh processing of the flash memory when the integrated weighted time period, which is calculated by adding up the weighted time periods of the operation modes, exceeds the predetermined threshold value. Thereby, the refresh control of a flash memory can be appropriately performed with a simple constitution.

Example 2

Next, description is given to an information processing apparatus, a non-transitory computer-readable storage medium storing a refresh control program, and a refresh control method according to Example 2 with reference to FIGS. 8A and 8B. Each of FIGS. 8A and 8B is a diagram illustrating the dependency of the data retention period of a flash memory on each of a cumulative amount of written data and a number of times of reading data.

As mentioned above, when the number of times of writing data for a flash memory increases, a gate insulating film may deteriorate, and the electrons of a floating gate may tend to escape easily to a silicon substrate. Accordingly, as illustrated in FIG. 8A, the data retention period of a flash memory tends to become short as a cumulative amount of written data (the cumulative number of erasing a data block) increases. Further, in a reading operation for a NAND type flash memory, with the addition of a voltage to a non-selected word line, electrons are subjected to tunneling injection, and a threshold voltage is raised, which results in that a correct value cannot be read out. Accordingly, as illustrated in FIG. 8B, the data retention period of a flash memory tends to become short as the number of times of reading operation increases.

Then, in this example, at the time of determining the intervals of execution of the refresh processing, weighting is performed by taking a cumulative amount of written data and/or the number of times of reading data into consideration, in addition to the temperature in the apparatus, whereby the refresh processing is enabled to be executed at more optimal intervals.

In concrete terms, the control section (flash memory control function) is configured to acquire a cumulative amount of written data and/or the number of times of reading data for a flash memory 202 by monitoring access to the flash memory 202, and to increase weighting coefficients to be used for the calculation of weighted operating time period, according to the cumulative amount of written (the cumulative number of times of erasing data blocks) and/or the number of times of reading data. Here, depending on the kind of a flash memory 202, there may be case where the device side holds information on a cumulative amount of written data the cumulative number of times of erasing data blocks). In such a case, the control section (flash memory control function) may refer to the values held by the device side.

For example, when the cumulative amount of written data and/or the number of times of reading data is given as S and a data retention period R is given as the following Formula 5 (that is, the data retention period is a function of the cumulative amount of written data and/or the number of times of reading data), a data retention period at the time of S=0 (device has not been used) is represented by Formula 6.

$$R=F(S) \qquad (5)$$

$$R0=F(0) \qquad (6)$$

When the weighting coefficient in the case of taking only temperature dependency into consideration is given as K, the weighting coefficient K' defined by taking the dependency about the cumulative amount of written data and/or the number of times of reading data in addition to temperature dependency into consideration is represented by the following Formula 7.

$$K'=K \times F(0)/F(S) \qquad (7)$$

In this way, by correcting a weighted operating time period with the consideration for a cumulative amount of written data and/or the number of times of reading data, the refresh processing of a flash memory can be performed at an execution timing.

Here, in the above description, the control section (flash memory control function) is configured to acquire the cumulative amount of written data and/or the number of times of reading data for a flash memory 202, and to correct weighting coefficients to be used for calculating weighted operating time period, in accordance with the cumulative amount of written data and/or the number of times of reading data. On the other hand, in the case where each constitutional element is configured to perform a prescribed operation for each operation mode (for example, a prescribed process is performed repeatedly at prescribed time intervals), it may be considered that an operation mode and a cumulative amount of written data or the number of times of reading data (in particular, the number of times of reading data) have a correlation between them. Accordingly, in this case, as with Example 1, the control section may just correct weighted operating time periods in accordance with the respective operation mode, and a cumulative amount of written data or the number of times of reading data may not be necessarily acquired for the calculation.

Example 3

Next, description is given to an information processing apparatus, a refresh control program, and a non-transitory computer-readable storage medium storing a refresh control method according to Example 3 with reference to FIGS. 9A and 9B. Each of FIGS. 9A and 9B is a timing chart illustrating an example of an execution timing of the refresh processing.

In the above-mentioned Example 1 and Example 2, when the integrated weighted time period exceeds the refresh threshold value, the refresh processing is made to be performed promptly. Alternatively, when the integrated weighted time period exceeds a refresh threshold value and an execution timing of the refresh processing has actually come, the control section can perform the following refresh control, so as to reduce the load which the refresh processing itself applies to the system.

In concrete terms, the CPU 200 acquires a bus usage rate of a flash memory 202. As illustrated in FIGS. 9A and 9B, at the time of executing the refresh processing, if the bus usage rate of the flash memory 202 exceeds a predetermined first threshold value (the initial threshold value in FIG. 9B) due to performing a certain process (here, a system processing A), the CPU 200 postpones the execution of the refresh processing. Subsequently, if the bus usage rate of the flash memory 202 becomes equal to or less than the initial threshold value, the CPU 200 starts the refresh processing.

Further, as illustrated in FIGS. 9A and 9B, in the course of executing the refresh processing, if the bus usage rate of the flash memory 202 exceeds a predetermined second threshold value (the suspension threshold value in FIG. 9B) due to performing a certain process (here, a system processing B), the CPU 200 suspends the refresh processing. Subsequently, if the bus usage rate of the flash memory 202 becomes equal to or less than the initial threshold value (or the suspension threshold value), the CPU 200 resumes the refresh processing.

Here, in this example, based on the bus usage rate of the flash memory 202, the execution timing of the refresh processing is controlled. However, if the start, sustention, and resume of the refresh processing is controlled with reference to an operation mode other than the bus usage rate, the load reduction effect for the system can be also attained. For example, in the case where the normal mode includes a first normal mode in which the system processing occurs frequently and a second normal mode in which the system processing almost does not occur, the control may be performed such that the refresh processing is not started during the first normal mode, and after the mode is shifted to the second normal mode, the refresh processing is started.

Example 4

Next, description is given to an information processing apparatus, a non-transitory computer-readable storage medium storing a refresh control program, and a refresh control method according to Example 4.

In the above-mentioned Example 1, on the supposition that the environmental temperature does not change greatly, the refresh control is performed based on the temperature of the apparatus. However, there is a possibility that a temperature in the apparatus in each operation mode differs greatly corresponding to the usage environment of an apparatus (for example, a country, a region, an installation location, etc.). Then, based on the usage environment of an apparatus, an expected temperature value in the vicinity of the apparatus in each operation mode is inferred, correction values of the weighting coefficients to be used for calculating the weighted operating time periods are calculated based on the temperature expectation value in the vicinity of the apparatus, and a table as shown in TABLE 2 is prepared and retained.

TABLE 2

| | Country | Region | Installed Location | Correction Value of Weighting Coefficient |
| --- | --- | --- | --- | --- |
| Environment Setting 1 | Japan | Tokyo | Office | Power OFF ±0<br>Sleep ±0<br>Normal ±0 |
| Environment Setting 2 *a* | Southeast Asia | XX | Warehouse | Power OFF ±0.5<br>Sleep ±0.5<br>Normal ±0.5 |
| Environment Setting 3 | Southeast Asia | XX | Office | Power OFF ±0.5<br>Sleep ±0<br>Normal ±0 |

*a*: (high atmosphere temperature through time)

Further, before using the apparatus, an environment setting based on the usage environment of the apparatus has been performed, and then, the weighting coefficients to be used for calculating the weighted operating time periods have been corrected with reference to the above-mentioned table in advance (that is, the weighting coefficients have been increased or decreased based on the usage environment in advance). With this, it becomes possible to execute the refresh processing for a flash memory at more optimal intervals according to the usage environment of the apparatus.

Example 5

Next, description is given to an information processing apparatus, a non-transitory computer-readable storage medium storing a refresh control program, and a refresh control method according to Example 5 with reference to FIGS. 10 to 12. FIG. 10 is a block diagram illustrating an example of the constitution of the information processing apparatus of Example 5. Further, FIG. 11 is a diagram illustrating a change of a temperature in the apparatus at the time of executing each process, and FIG. 12 is a diagram for illustrating a correction of weighting coefficients by using the counted number of times of execution of processes.

In the above-mentioned Example 1, the description was given to the refresh control in the case of using a general information processing apparatus. However, in this example, description is given to the case where a MFP is used as an example of an information processing apparatus. As illustrated in FIG. 10, the MFP is constituted by a control section 300, a UI (User Interface) section 307, an image reading section 308, an image forming section 309, and so on.

The control section 300 is constituted by a CPU 301; a main memory 302, such as a ROM and a RAM; a flash memory 303; a MPU 304 which includes an RTC and a FRAM (trademark); a backup power source 305, such as a battery; an image processing section 306, and others. The image processing section 306 can be an ASIC (Application Specific Integrated Circuit), and is configured to perform image processing, such as edge enhancement processing, smoothing processing, and color conversion processing, to image data read by the image reading section 308.

The UI sections 307 includes a display section, such as an LCD (Liquid Crystal Display), a touch panel, such as a pressure sensing type and a capacitance type, a hard key, and the like, and is configured to display a setting screen used to set processing conditions and to allow a user to perform a setting operation for the processing conditions and issue an execution instruction of processing.

The image reading section 308 is a section adapted to read optically image data from a document placed on a document stand, and is constituted by a light source to scan a document with light, an image sensor, such as CCDs (Charge Coupled Devices) configured to convert light reflected on the document into electrical signals, an A/D converter configured to perform A/D conversion for the electrical signals, and the like.

The image forming section 309 is a section configured to perform print processing on sheets of paper based on image data having been subjected to the image processing at the image processing section 306. In concrete terms, the image forming section 309 is configured to form an electrostatic latent image by irradiating light corresponding to an image from an exposing apparatus to a photoreceptor drum charged with an electrically-charging apparatus, to develop the latent image by making charged toner adhere in a developing device, to transfer primarily the toner image onto a transfer belt, to transfer secondarily the toner image from the transfer belt to a sheet, and to fix the toner image onto the sheet in a fixing device.

In the above-mentioned constitution, the fixing device generally needs to be at a temperature of about 160° C. to 180° C. in order to fix toner onto a sheet surface, and becomes a very high temperature in the course of the fixing process. For this reason, in a MFP or a laser beam printer, a temperature in an apparatus changes remarkably depending on an ON/OFF control of the fixing apparatus. Further, in the MFP, the temperature in the apparatus changes depending on an operation mode, such as "normal", "sleep", and "power OFF". In addition, control is performed such that the temperature of the fixing apparatus is raised rapidly right before performing toner fixing onto a sheet surface. Accordingly, even in the case where the MFP is working in at the same mode, the temperature in the apparatus changes greatly in response to the usage situation of the apparatus. For example, in FIG. 11, the processing A and the processing B are a copy job and a printing job, respectively, and at the time of performing these processes, the temperature in the apparatus rises rapidly.

Further, not only the MFP, but also in apparatuses in which a temperature in the apparatus changes greatly in response to various processing, it is also necessary to take processing to be executed in each mode into consideration, in addition to the time periods of the operation modes.

In this example, in apparatuses in which a remarkable apparatus temperature change occurs corresponding to execution of processes, as with the MFP, the control section of the apparatus conducts the following control. The control section, as illustrated in FIG. 12, at the time of adding up the weighted time period in each operation mode, counts the number of times of execution of processing having been executed from the time of the last calculation of adding up the weighted time period, to the current time, for each kind of processing. Subsequently, the control section calculates the final weighting coefficients based on the counted number of times of the execution of processing for each kind of processing, the correction value previously set for each kind of the processing with consideration of the degree of influence to the temperature in the apparatus, and the weighting coefficient previously set for each operation mode. Then, the control section calculates the weighted operating time periods based on the final weighting coefficients and adds up the weighted operating time periods to obtain the integrated weighted time period.

With this, also for apparatuses in which a temperature in the apparatus changes greatly in response to processing, it becomes possible to determine appropriately intervals at which the refresh processing is performed.

Here, the present invention should not be limited to the above-mentioned embodiments and examples. The constitution and control may be modified appropriately, unless such modification deviates from the intention of the present invention. For example, in the above-mentioned examples, as operation modes, three operation modes of the power OFF mode, the power saving mode, and the normal mode are exemplified. However, any operation modes may be permissible as far as the concerned apparatus can work in multiple operation modes.

The invention claimed is:

1. An information processing apparatus which can work in a plurality of operation modes, comprising:
   a flash memory; and
   a control section configured to
      acquire a time period for which the information processing apparatus has been working in each of the operation modes, as an operating time period of each of the operation modes,
      calculate a weighted time period of each of the operation modes by weighting the operating time period of each of the operation modes by using a weighting coefficient of the corresponding operation mode, and
      perform refresh processing of the flash memory, on an integrated weighted time period exceeding a refresh threshold value which has been determined previously, the integrated weighted time period being calculated by adding up the weighted time periods of the operation modes.

2. The information processing apparatus of claim 1, wherein the control section is configured to weight the operating time period of each of the operation modes by using the weighting coefficient of the corresponding operation mode, to correct a change of a data retention period of the flash memory, the change coming from a temperature of the information processing apparatus correlated with the operation modes.

3. The information processing apparatus of claim 1, wherein the control section is configured to
   acquire an amount of written data which have been written for the flash memory, and
   increase the weighting coefficients of the operation modes to be used for calculating the weighted time periods of the operation modes, according to the amount of written data.

4. The information processing apparatus of claim 1,
wherein the control section is configured to
acquire a number of times of reading data from the flash memory, and
increase the weighting coefficients of the operation modes to be used for calculating the weighted time periods of the operation modes, according to the number of times of reading data.

5. The information processing apparatus of claim 1,
wherein the control section is configured to
count a number of execution of processing which has been performed in each of the operation mode, for each kind of processing,
correct the weighting coefficient of each of the operation modes based on the counted number for each kind of processing and on a correction value previously set for each kind of processing, to obtain a corrected weighting coefficient of each of the operation modes,
calculate the weighted time period of each of the operation modes by using the corrected weighting coefficient of the corresponding operation mode, and
define timing of performing the refresh processing based on the integrated weighted time period calculated by adding up the weighted time periods of the operation modes.

6. The information processing apparatus of claim 1,
wherein the control section is configured to increase or decrease the weighting coefficients of the operation modes, based on a usage environment of the information forming apparatus.

7. The information processing apparatus of claim 1,
wherein the control section is configured to
acquire a usage rate of a bus of the flash memory,
postpone performing the refreshing processing, on the usage rate of the bus exceeding a first threshold value which has been defined previously, regardless of an excess of the integrated weighted time period over the refresh threshold value, and
start the refresh processing on the usage rate of the bus of the flash memory being equal to or less than the first threshold value.

8. The information processing apparatus of claim 7,
wherein the control section is configured to
suspend the refreshing processing, on the usage rate of the bus excessing a second threshold value which has been defined previously during the refresh processing, and
resume the refreshing processing on the usage rate of the bus being equal to or less than one of the first threshold value and the second threshold value.

9. A non-transitory computer-readable storage medium storing a refresh control program to be executed in an information processing apparatus which can work in a plurality of operation modes and includes a flash memory, the refresh control program, when being executed by a processor of the information processing apparatus, causing the processor to perform processes comprising:
acquiring a time period for which the information processing apparatus has been working in each of the operation modes, as an operating time period of each of the operation modes;
calculating a weighted time period of each of the operation modes by weighting the operating time period of each of the operation modes by using a weighting coefficient of the corresponding operation mode;
comparing an integrated weighed time period with a refresh threshold value which has been determined previously, the integrated weighted time period being calculated by adding up the weighted time periods of the operation modes; and
performing refresh processing of the flash memory, on the integrated weighted time period exceeding the refresh threshold value.

10. The non-transitory computer-readable storage medium of claim 9,
wherein the calculating weighted time period includes
weighting the operating time period of each of the operation modes by using the weighting coefficient of the corresponding operation mode, to correct a change of a data retention period of the flash memory, the change coming from a temperature of the information processing apparatus correlated with the operation modes.

11. The non-transitory computer-readable storage medium of claim 9,
wherein the calculating weighted time period includes
acquiring an amount of written data which have been written for the flash memory, and
increasing the weighting coefficients of the operation modes to be used for calculating the weighted time periods of the operation modes, according to the amount of written data.

12. The non-transitory computer-readable storage medium of claim 9,
wherein the calculating weighted time period includes
acquiring a number of times of reading data from the flash memory, and
increasing the weighting coefficients of the operation modes to be used for calculating the weighted time periods of the operation modes, according to the number of times of reading data.

13. The non-transitory computer-readable storage medium of claim 9,
wherein the calculating weighted time period includes
counting a number of execution of processing which has been performed in each of the operation mode, for each kind of processing, and
correcting the weighting coefficient of each of the operation modes based on the counted number for each kind of processing and on a correction value previously set for each kind of processing.

14. The non-transitory computer-readable storage medium of claim 9,
wherein the calculating weighted time period includes
increasing or decreasing the weighting coefficients of the operation modes, based on a usage environment of the information forming apparatus.

15. The non-transitory computer-readable storage medium of claim 9,
wherein the performing the refresh processing includes
acquiring a usage rate of a bus of the flash memory,
postponing performing the refreshing processing, on the usage rate of the bus exceeding a first threshold value which has been defined previously, regardless of an excess of the integrated weighted time period over the refresh threshold value, and
starting the refresh processing on the usage rate of the bus of the flash memory being equal to or less than the first threshold value.

16. The non-transitory computer-readable storage medium of claim 15, wherein the performing the refresh processing includes
suspending the refreshing processing, on the usage rate of the bus excessing a second threshold value which has been defined previously during the refresh processing, and
resuming the refreshing processing on the usage rate of the bus being equal to or less than one of the first threshold value and the second threshold value.

17. A refresh control method of an information processing apparatus which can work in a plurality of operation modes and includes a flash memory, the method comprising:
acquiring a time period for which the information processing apparatus has been working in each of the operation modes, as an operating time period of each of the operation modes;
calculating a weighted time period of each of the operation modes by weighting the operating time period of each of the operation modes by using a weighting coefficient of the corresponding operation mode;
comparing an integrated weighed time period with a refresh threshold value which has been determined previously, the integrated weighted time period being calculated by adding up the weighted time periods of the operation modes; and
performing refresh processing of the flash memory, on the integrated weighted time period exceeding the refresh threshold value.

18. The refresh control method of claim 17,
wherein the calculating weighted time period includes
weighting the operating time period of each of the operation modes by using the weighting coefficient of the corresponding operation mode, to correct a change of a data retention period of the flash memory, the change coming from a temperature of the information processing apparatus correlated with the operation modes.

19. The refresh control method of claim 17,
wherein the calculating weighted time period includes
acquiring an amount of written data which have been written for the flash memory, and
increasing the weighting coefficients of the operation modes to be used for calculating the weighted time periods of the operation modes, according to the amount of written data.

20. The refresh control method of claim 17,
wherein the calculating weighted time period includes
acquiring a number of times of reading data from the flash memory, and
increasing the weighting coefficients of the operation modes to be used for calculating the weighted time periods of the operation modes, according to the number of times of reading data.

21. The refresh control method of claim 17,
wherein the calculating weighted time period includes
counting a number of execution of processing which has been performed in each of the operation mode, for each kind of processing, and
correcting the weighting coefficient of each of the operation modes based on the counted number for each kind of processing and on a correction value previously set for each kind of processing.

22. The refresh control method of claim 17,
wherein the calculating weighted time period includes
increasing or decreasing the weighting coefficients of the operation modes, based on a usage environment of the information forming apparatus.

23. The refresh control method of claim 17,
wherein the performing the refresh processing includes
acquiring a usage rate of a bus of the flash memory,
postponing performing the refreshing processing, on the usage rate of the bus exceeding a first threshold value which has been defined previously, regardless of an excess of the integrated weighted time period over the refresh threshold value, and
starting the refresh processing on the usage rate of the bus of the flash memory being equal to or less than the first threshold value.

24. The refresh control method of claim 23,
wherein the performing the refresh processing includes
suspending the refreshing processing, on the usage rate of the bus excessing a second threshold value which has been defined previously during the refresh processing, and
resuming the refreshing processing on the usage rate of the bus being equal to or less than one of the first threshold value and the second threshold value.

\* \* \* \* \*